(12) United States Patent
Lwee (10) Patent No.: US 6,666,724 B1
(45) Date of Patent: Dec. 23, 2003

(54) MULTI-PURPOSE CARD CONNECTOR

(75) Inventor: Nai-Hock Lwee, Singapore (SG)

(73) Assignee: Tai-Sol Electronics, Co., Ltd., Taipei Hsien (TW)

( * ) Notice: Subject to any disclaimer, the term of this patent is extended or adjusted under 35 U.S.C. 154(b) by 0 days.

(21) Appl. No.: 10/331,537

(22) Filed: Dec. 31, 2002

(30) Foreign Application Priority Data

Oct. 23, 2002 (TW) ....................................... 91216934 U (51) Int. Cl.⁷ .............................................. H01R 24/00
(52) U.S. Cl. .................... 439/630; 439/138; 439/541.5; 439/633; 439/680
(58) Field of Search .............................. 439/630, 541.5, 439/633, 677, 680, 138, 142

(56) References Cited

U.S. PATENT DOCUMENTS

| | | | | |
|---|---|---|---|---|
| 3,990,758 A | * | 11/1976 | Petterson | 439/138 |
| 5,161,989 A | * | 11/1992 | Okubo et al. | 439/159 |
| 5,577,922 A | * | 11/1996 | Enomoto et al. | 439/157 |
| 5,980,276 A | * | 11/1999 | Arita et al. | 439/131 |
| 6,149,466 A | * | 11/2000 | Bricaud et al. | 439/630 |
| 6,268,122 B1 | * | 7/2001 | Murray | 435/5 |
| 6,558,175 B1 | * | 5/2003 | Yu | 439/138 |
| 6,572,396 B1 | * | 6/2003 | Rathburn | 439/260 |

* cited by examiner

*Primary Examiner*—Truc Nguyen
(74) *Attorney, Agent, or Firm*—Bacon & Thomas, PLLC (57) ABSTRACT

A multi-purpose card connector is composed of a housing, a front deck, a switching block, and a card receiving connector. The housing includes an open base frame, which is bonded with two PC boards at top and bottom sides thereof and is provided with two receiving open chambers for accommodating different cards. Each of the PC boards has a circuit pattern and a plurality of slots. An opening is positioned at a front end of one PC board, which is positioned above the other. The front deck is mounted on the PC board above the other and at a front end of the opening of the PC board at a top side of the open base frame. The switching is pivotally connected with the front deck and has first and second extension portions. The card receiving connector is mounted on the PC board above the other and at a rear side of the front deck and is provided with a plurality of contact pikes, each of which has an end connecting to circuits of the PC board.

8 Claims, 8 Drawing Sheets

MULTI-PURPOSE CARD CONNECTOR

BACKGROUND OF THE INVENTION

1. Field of the Invention

The present invention relates to card connectors, and more particularly to a multi-purpose card connector, which fits any of a variety of commercially available memory cards, and accepts only one card at a time.

2. Description of the Related Art

A conventional memory card connector, for example, a card connector constructed according to U.S. Pat. No. 6,402,529 is compatible to three kinds of memory cards, i.e. multimedia card (MMC), secure digital (SD), and smart media (SM). The card connector includes two accommodation portions for receiving different kinds of cards with different external shapes and different contact pads to be inserted into the card connector from one and the same card insertion slot. A plurality of copper strips are provided inside the housing of the card connector for contacting contact pads of an inserted memory card, and are extended to a rear side of the card connector for connecting external circuit means.

The aforesaid prior art is not compatible to other specifications of memory cards, such as compact flash (CF) memory cards. If a card connector needs a CF card socket while installed in an applied apparatus, such as a digital camera, the CF card socket must be additionally installed to the card connector. However, because the card connector and the additionally installed CF card socket are two independent members combined together, an unexpected result may occur when a user carelessly inserts two different memory cards into the card connector and the CF card socket at the same time.

SUMMARY OF THE INVENTION

The present invention has been accomplished under the circumstances in view. It is therefore the main object of the present invention to provide a multi-purpose card connector, which fits any of a variety of commercially available memory cards including MMC, SD, SM, and CF cards and, prohibits insertion of two cards at a time.

To achieve this and other objects of the present invention, the multi-purpose card connector is composed of a housing, a plurality of contact pins, a plurality of lead wires, a front deck, a switching block, and a card receiving connector. The housing includes an open base frame, which is bonded with two PC boards at top and bottom sides thereof and is provided with two receiving open chambers defined between the open base frame and the two PC boards for accommodating different cards. Each of the PC boards has a circuit pattern and a plurality of slots. Each of the contact pins has an end connected to circuits of the PC boards and is partially received in the slots of the PC boards. The lead wires are symmetrically positioned at two sides of the housing and are electrically connected to the circuits of the PC boards. An opening is positioned at a front end of one PC board, which is positioned above the other. The front deck is mounted on the PC board above the other and at a front end of the opening of the PC board at a top side of the open base frame. The switching block has a pivot shaft fastened pivotally with the front deck, and first and second extension portions extending from a periphery of the pivot shaft and relatively arranged at a predetermined angle and pivotally moving in and out of the opening. The card receiving connector is mounted on the PC board above the other and at a rear side of the front deck. The card receiving connector includes a transversely extending, narrow, elongated base and two longitudinal side arms arranged in parallel at two ends of the base. The base of the card receiving connector is provided with a plurality of contact pikes, each of which has an end connecting to the circuits of the PC board.

DETAILED DESCRIPTION OF THE INVENTION

Referring to FIGS. 1–5, a multi-purpose card connector 10 in accordance with the present invention is composed of a housing 11, a front deck 21, a switching block 31, and a card receiving connector 41.

The housing 11 includes an open base frame 14, which is bonded with two PC boards 12 at top and bottom sides of the open base frame 14 and defines two receiving open chambers 16 together with the two PC boards 12 for receiving different cards (not shown). Each PC board 12 has a circuit pattern (not shown) and a plurality of slots 13, a plurality of contact pins 18 respectively connected to the circuits of the PC boards 12 and partially received in the slots 13 of the PC boards 12 and suspended in at least one of the receiving open chambers 16 for electrically connecting the contact pads of an inserted card, and a plurality of lead wires 19 symmetrically disposed at two sides thereof and electrically connected to the circuits of at least one of the PC boards 12 for electrically connecting the circuits of the PC boards 12. Additionally, the tops-sided PC board 12 has an opening 121 near a front middle side thereof.

The front deck 21 is a narrow elongated flat member fixedly mounted on the top-sided PC board 12, having a front opening 22 vertically aligned with the opening 121 of the top-sided PC board 12, two recessed pivot holes 24 positioned at two sides of the front opening 22, a sector face 221 in a rear side of the front opening 22, two beveled bottom recesses 222 positioned at a bottom side thereof and spaced apart from the pivot holes 24 and the sector face 221, and two mounting holes 26 at the two sides thereof.

The switching block 31 includes a transversely extending pivot shaft 32 pivotally connected to the recessed pivot holes 24 of the front deck 21, two plate-like flat extension portions 34, a first and second flat extension 341 and 342, extending from a periphery of the pivot shaft 32 and relatively arranged at a angle of 90°, and a sector wall 35 positioned between the two flat extension portions 34. Each of the extension portions 34 has a rib 349 at an outer side thereof. The first flat extension portion 341 has a stop wall 343, which corresponds to the sector face 221, at a distal end thereof. The second flat extension portion 342 has two lugs 344, which corresponds to the beveled bottom recesses 222 at two sides of a free end. While the switching block 31 is installed in the front deck 21, the switching block 31 can be turned about the pivot shaft 32, which is inserted into the recessed pivot holes 24, such that the extension portions 34 move in and out of the opening 121 of the top-sided PC board 12.

The card receiving connector 41 is a substantially U-shaped member having a transversely extending, narrow, elongated base 42, two longitudinal side arms 44 arranged in parallel at two ends of the base 42, a plurality of contact pikes 43 on the base 42, and two mounting rods 45 respectively at bottom sides of the side arms 44 thereof and respectively plugged into the mounting holes 26 of the front deck 21 to secure the card receiving connector 41 fixed to the front deck 21 and the top-sided PC board 12. The card receiving connector 41 is mounted on one of the PC boards 12, the contact pikes 43 are respectively bonded (soldered) to the circuits of this PC board 12.

Figure 1:
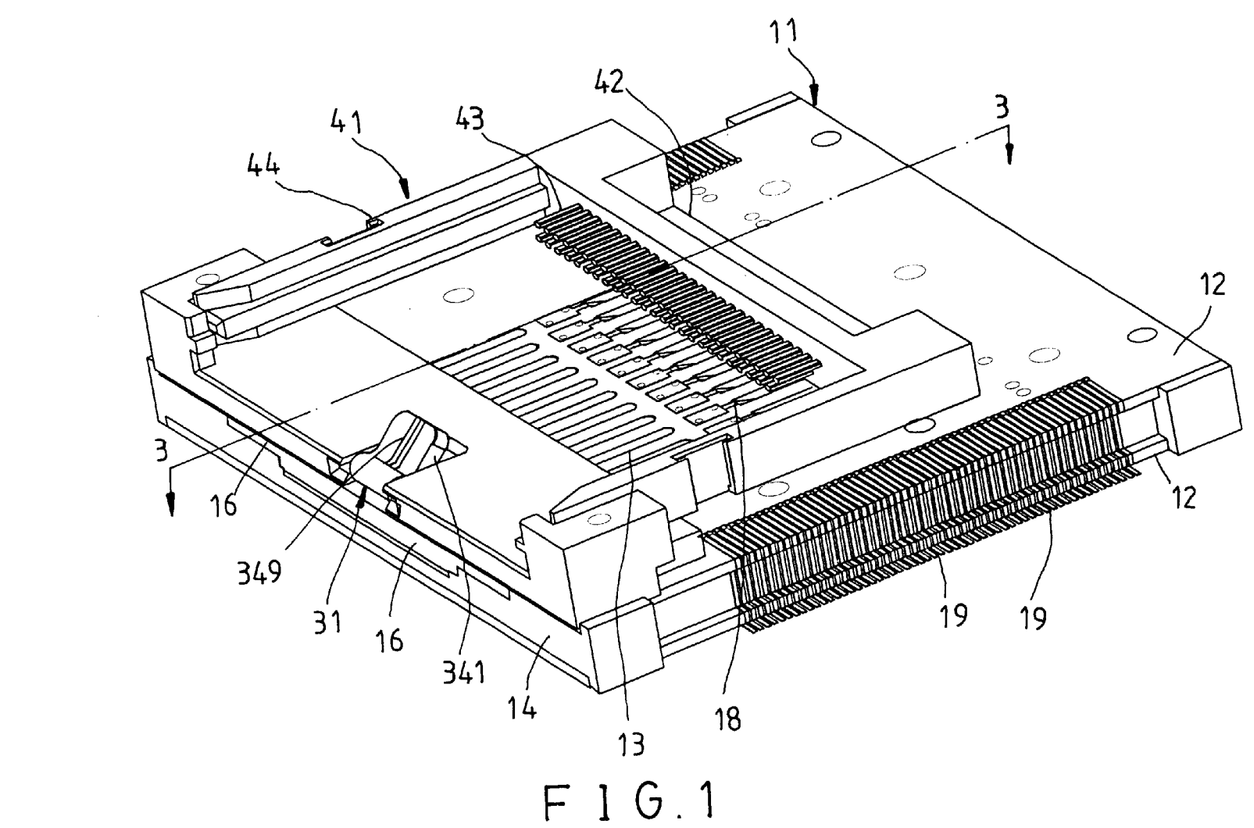
FIG. 1 is a perspective view of a first preferred embodiment of the present invention.
Figure 2:
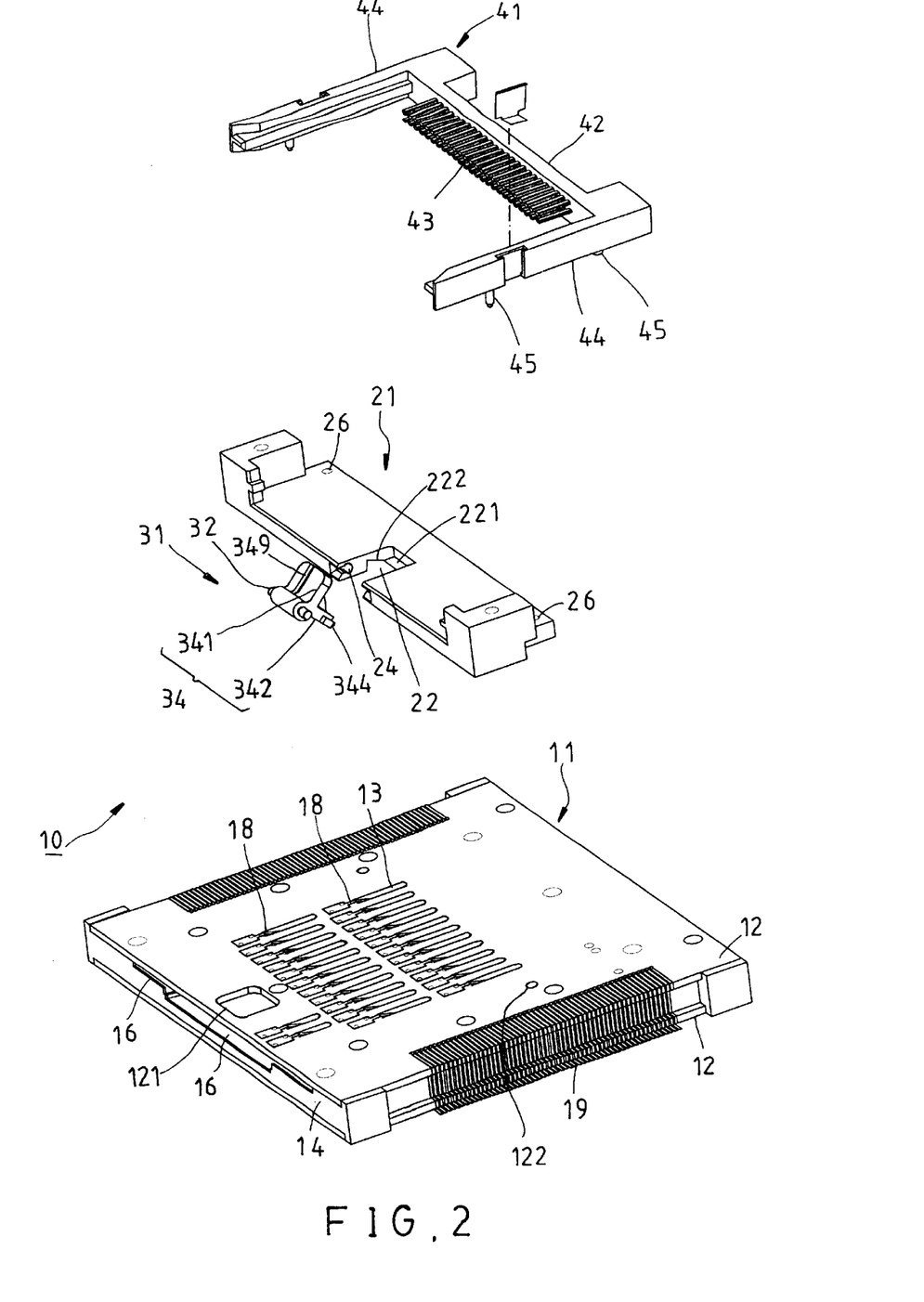
FIG. 2 is an exploded view of the first preferred embodiment of the present invention.
Figure 3:
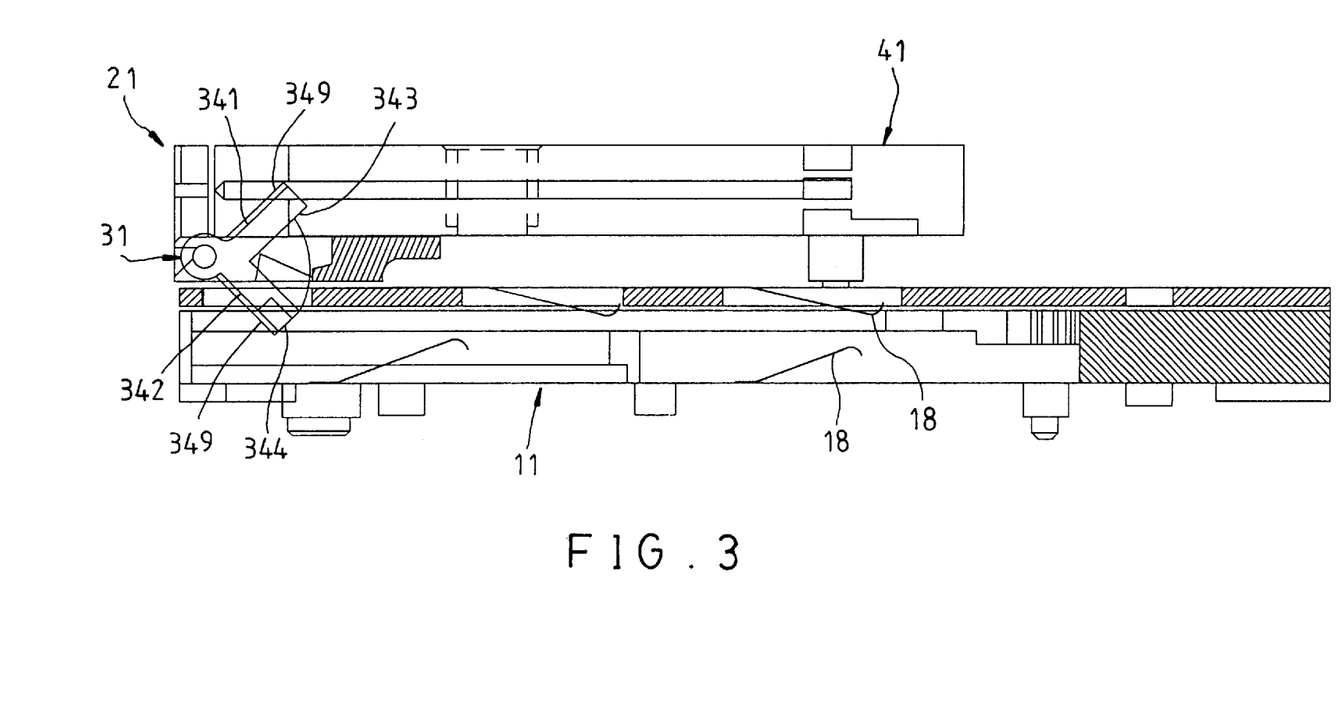
FIG. 3 is an enlarged sectional view taken along a line 3—3 indicated in FIG. 1.
Figure 4:
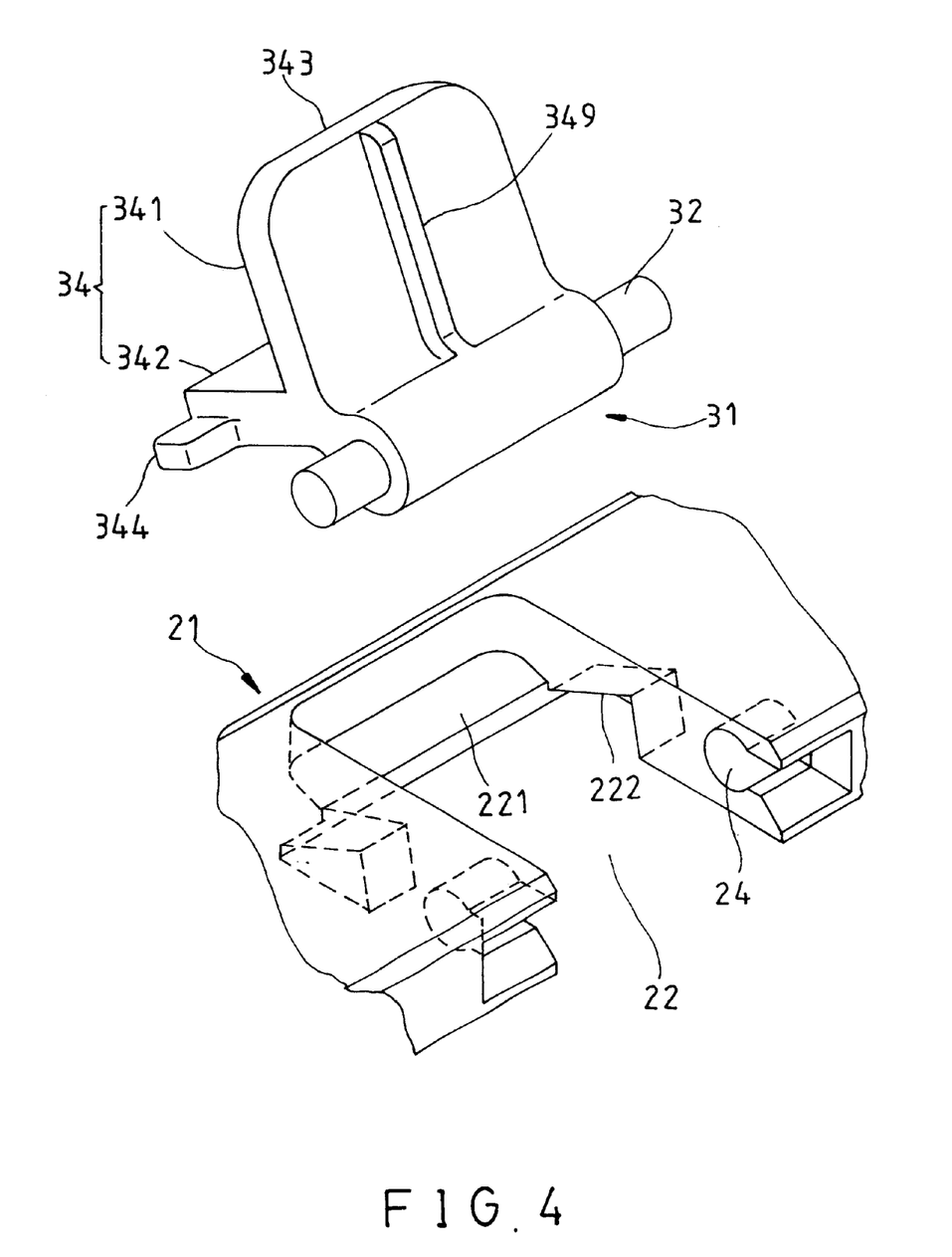
FIG. 4 is a partial enlarged exploded view of the first preferred embodiment of the present invention.
Figure 5:
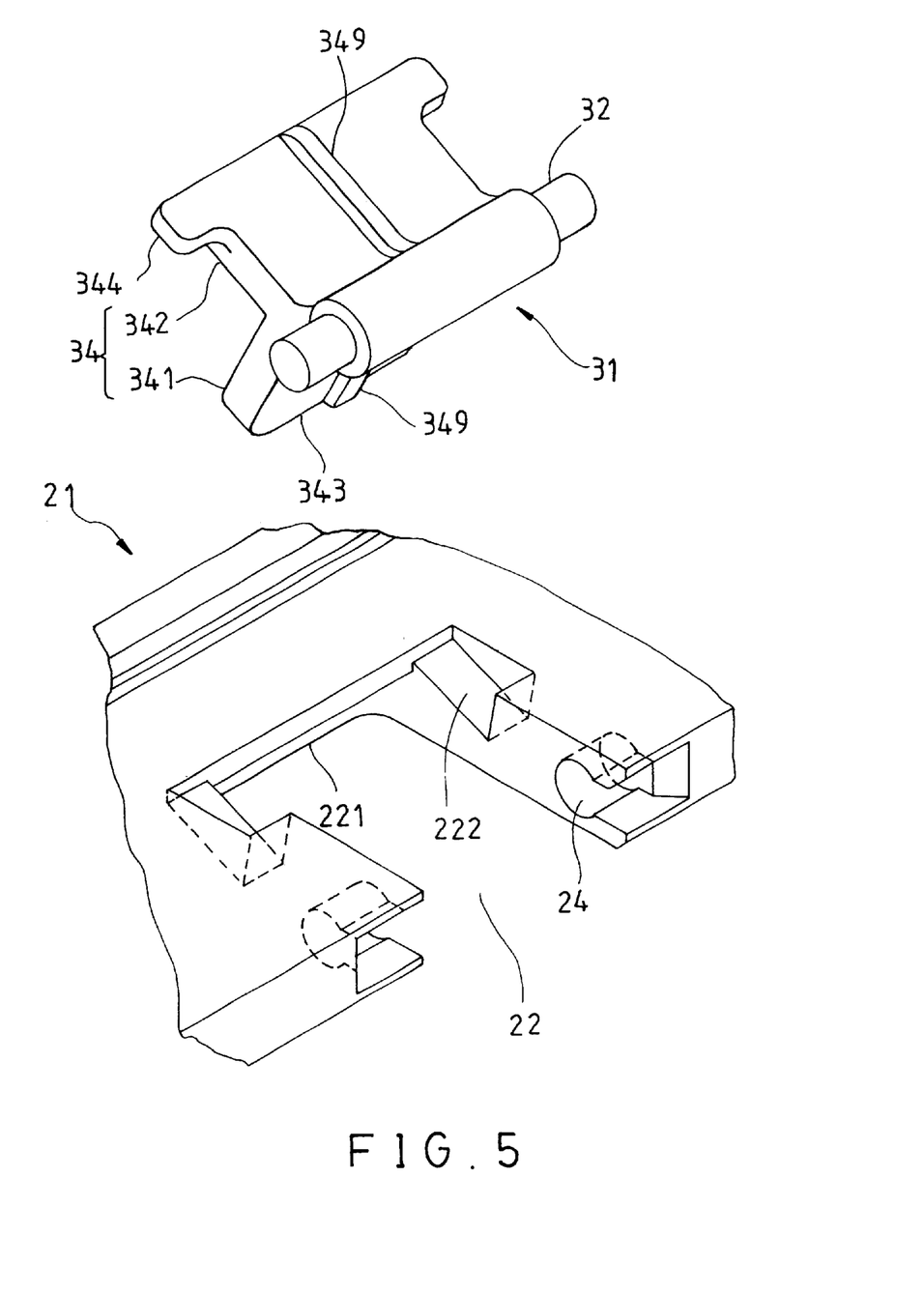
FIG. 5 is similar to FIG. 4 but viewed from another angle.
Figure 6:
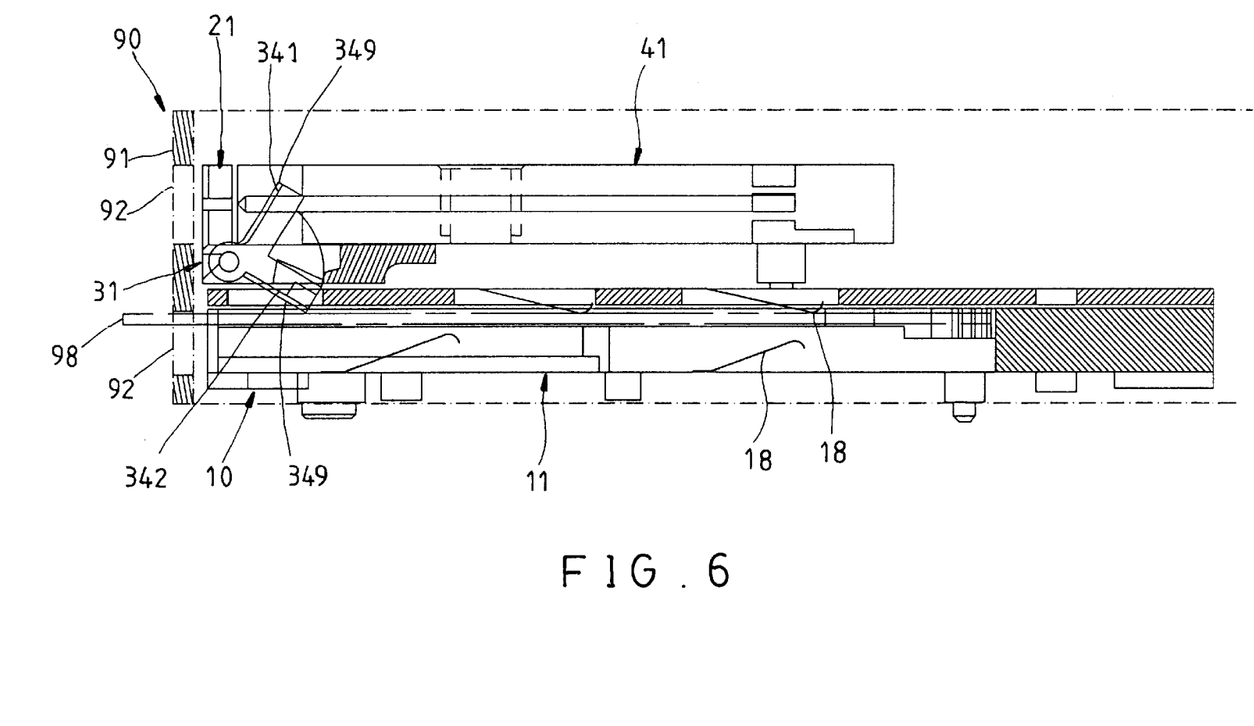
FIG. 6 is a schematic view of the first preferred embodiment of the present invention at work.

Referring to FIG. 6, the present invention is applied in a card readable apparatus embodied as a digital camera 90, which is composed of a casing 91, two insertion slots 92 positioned in the casing 91. The housing 11 and the card receiving connector 41 respectively face the insertion slots 92, thereby inserting a memory card 98 through one of insertion slots 92 into the housing 11 or the card receiving connector 41 and keeping the inserted memory card 98 in close contact with the contact pins 18 or the contact pikes 43 to be electrically connected with the contact pins 18 or the contact pikes 43 for accessing the memory card 98. The housing 11 is adapted to receive four kinds of cards, i.e. SD, MMC, SM, memory stick (MS). The card receiving connector 21 is adapted to fit tow kinds of memory cards (CF1 and CF2). Therefore, the card connector is compatible to six kinds of memory cards.

While turning the switching block, the lugs 344 or the stop wall 343 will be stopped at the beveled bottom recesses 222 or the sector face 221 to limit a turning angle of the switching block 31, such that it will not happen that the memory card fails to be inserted.

Figure 7:
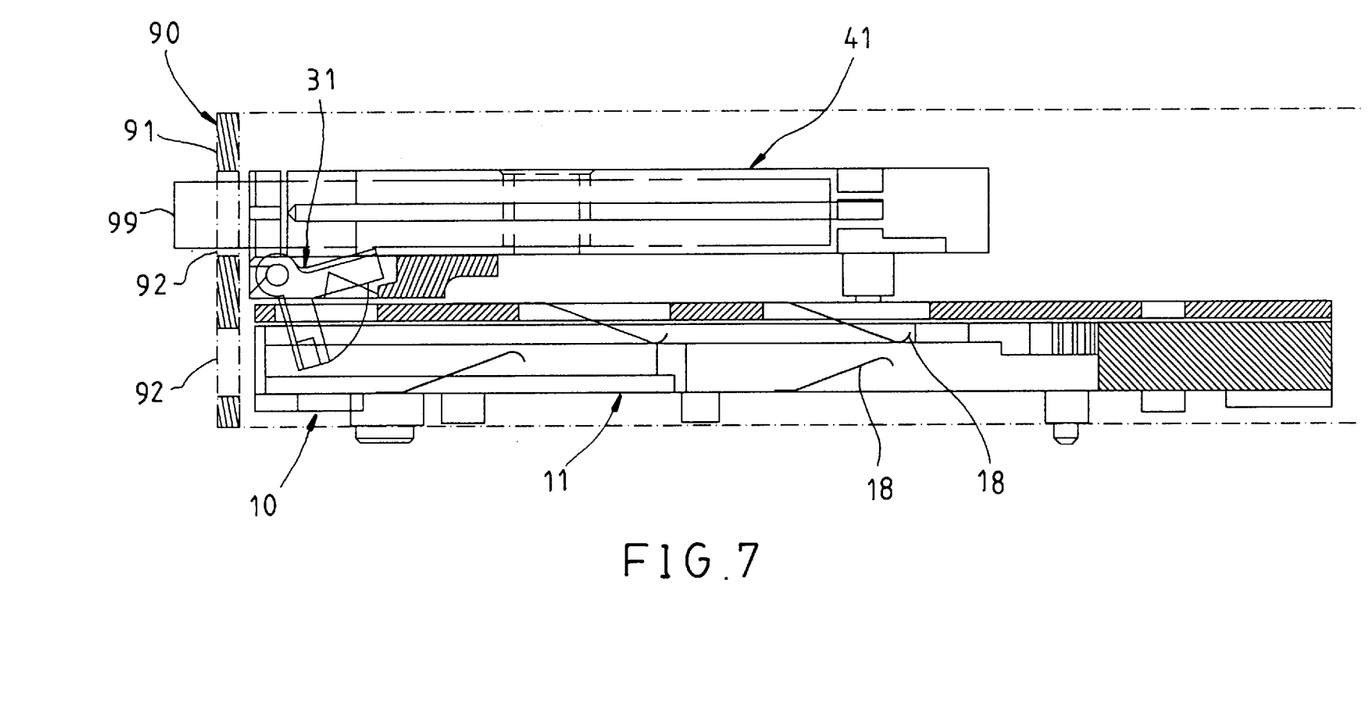
FIG. 7 is another schematic view of the first preferred embodiment of the present invention at work.

Referring to FIGS. 6 and 7, when the user inserts a SD card 98 into a single loading port of multi-purpose card connector 10, the rib 349 of the second extension portion 342 is forced by the SD card 98 to turn the switching block 31 upwards, thereby causing the switching block 31 to enter the card receiving connector 41. At the same time, the switching block 41 blocks the card receiving connector 41, and the user cannot insert a CF card 99 into the card receiving connector 41. While intending to insert a CF card 99 at this time, the user must remove the inserted SD card 98 from the housing 11, and then insert the CF card 99 into the card receiving connector 41 (see FIG. 7). After inserting the CF card 99 into the card receiving connector 41, the switching block 31 is turned in a reversed direction to block the receiving open chambers 16 (see also FIG. 1), thereby preventing from inserting another memory card into the housing 11.

Figure 8:
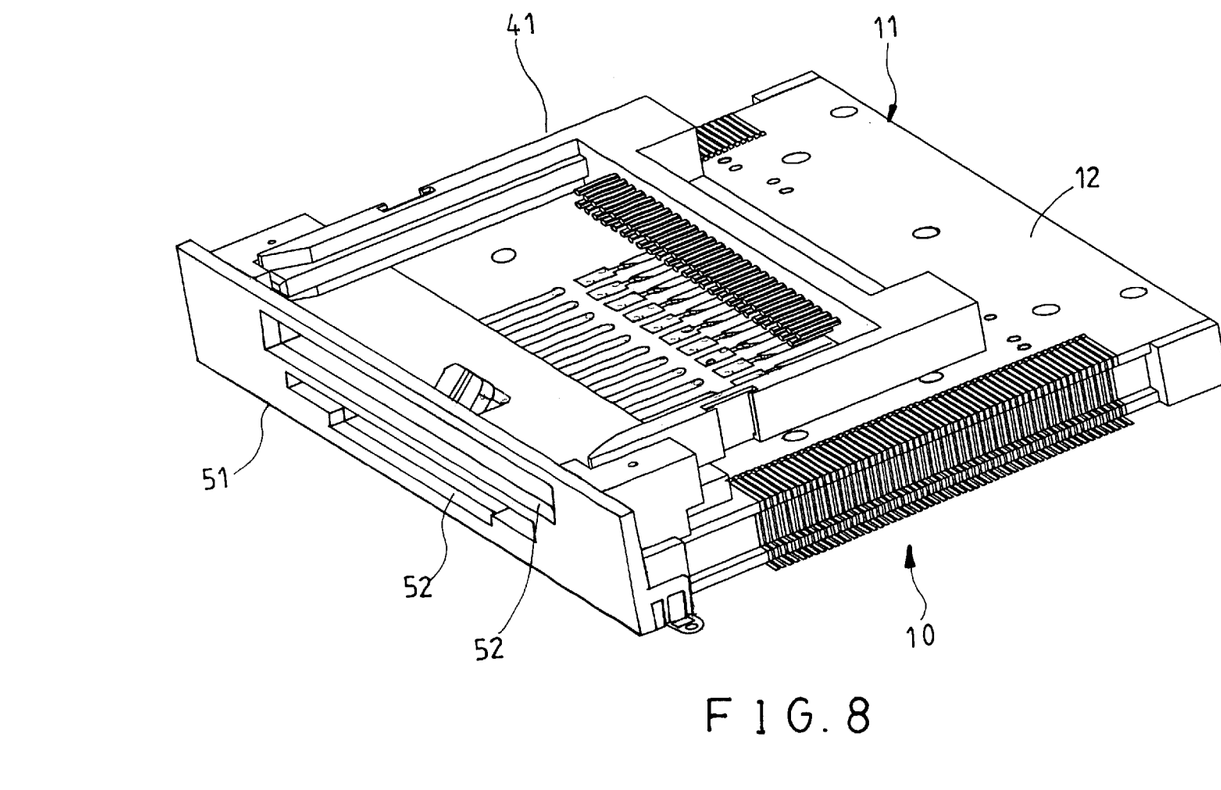
FIG. 8 is a perspective view of a grounding member installed in the first preferred embodiment of the present invention.

Referring to FIG. 8, a metal grounding member 51 is mounted on a front side of the housing 11 and is electrically connected to grounding circuits of the PC boards 12, having two openings 52 corresponding to card insertion positions of the housing 11 and the card receiving connector 41. The metal grounding member 51 absorbs static electricity produced while a card is inserted into the card receiving connector 41 or the housing 11, thereby preventing from a surge that may damage electronic component parts of the card connector 10.

In the aforesaid embodiment, it is to be noted that since the opening 121 is located at the front middle side of the top-sided PC board 12, the opening 121 can be alternatively positioned beside the front middle side of the top-sided PC board 12 as long as an inserted card can pass through.

What is claimed is:

1. A multi-purpose card connector comprising:

a housing including an open base frame, two PC boards bonded to top and bottom sides of said open base frame, two receiving open chambers defined by said open base frame and said two PC boards for receiving different cards, said PC boards respectively having a circuit pattern and a plurality of slots, a plurality of contact pins respectively connected to circuits of said PC boards and partially received in said slots of said PC boards and suspended in said receiving open chambers for contacting and electrically connected with contact pads of an inserted card, and a plurality of lead wires symmetrically disposed at two sides thereof and electrically connected to the circuits of said PC boards, wherein said PC board at the top side of said open base frame has an opening at a front end thereof;

a front deck mounted on said PC board at the top side of said open base frame and beside the opening;

a switching block having a pivot shaft connected pivotally with said front deck and first and second extension portions extending from a periphery of said pivot shaft and relatively arranged at a predetermined angle, while said switch block is pivoted, said switching block moves in or out of the opening; and a card receiving connector mounted said PC board at the top side of said open base frame and behind said front deck and having a base, two lateral side arms, a plurality of contact pikes respectively having an end bonded to the circuits of said PC board.

2. The multi-purpose card connector as defined in claim 1, wherein the opening of said PC board at the top side of said open base frame is located on a front middle side of said PC board.

3. The card connector as defined in claim 1, wherein said front deck has a front opening corresponding to the opening of said PC board at the top side of said open base frame, and two recessed pivot holes positioned at two sides of said front opening, and said pivot shaft of said switching block has two distal ends respectively coupled to said recessed pivot holes of said front deck.

4. The multi-purpose card connector as defined in claim 1, wherein said card receiving connector has a plurality of mounting rods respectively positioned at bottom sides of front ends of said two lateral side arms, and said front deck has two mounting holes for plugging said mounting rods respectively.

5. The multi-purpose card connector as defined in claim 1, wherein said first and second extension portions of said switching block are plate-like flat members.

6. The multi-purpose card connector as defined in claim 5, wherein said switching block has a sector wall connected between said first and second extension portions, said first extension portion having a stop wall at a distal end thereof, said second extension portion having two lugs at two sides of a distal end thereof, and said front deck has a front opening corresponding to the opening of said PC board at the top side of said open base frame, a sector face positioned at a rear side of said front opening and adapted to stop the stop wall of said first extension portion, and two beveled bottom recesses positioned at two sides of said front opening thereof and adapted to receive said lugs of said second extension portion.

7. The multi-purpose card connector as defined in claim 5, wherein said first and second extension portions have a rib at an outer side.

8. The multi-purpose card connector as defined in claim 1 further comprising a metal grounding member fixedly mounted on said housing and electrically connected to grounding circuits of said PC boards, said metal grounding member having at least one opening for inserting a card into one of said housing and said card receiving connector.

* * * * *